US006596652B2

(12) United States Patent
Yang et al.

(10) Patent No.: US 6,596,652 B2
(45) Date of Patent: Jul. 22, 2003

(54) METHOD OF FABRICATING LOW DIELECTRIC CONSTANT FILM

(75) Inventors: Neng-Hui Yang, Hsinchu (TW); Ming-Sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/798,244

(22) Filed: Mar. 6, 2001

(65) Prior Publication Data

US 2002/0127874 A1 Sep. 12, 2002

(51) Int. Cl.$^{7}$ ........................ H01L 21/31; H01L 21/469

(52) U.S. Cl. ........................ 438/780; 438/786; 438/789; 438/793

(58) Field of Search ................................ 438/780, 786, 438/789, 793, FOR 395; 427/99, 255.3

(56) References Cited

U.S. PATENT DOCUMENTS 4,775,550 A * 10/1988 Chu et al. ............. 427/255.15
6,017,791 A * 1/2000 Wang et al. ................ 438/253
6,096,592 A * 8/2000 Cho ........................... 438/238
6,146,988 A * 11/2000 Ngo et al. .................. 438/618
6,210,997 B1 * 4/2001 Adachi et al. ............. 438/151
6,291,363 B1 * 9/2001 Yin et al. ................... 438/769
6,444,037 B1 * 9/2002 Frankel et al. ............. 118/715
2002/0031895 A1 * 3/2002 Ping ........................... 438/396

* cited by examiner

*Primary Examiner*—George Fourson
*Assistant Examiner*—Michelle Estrada
(74) *Attorney, Agent, or Firm*—J.C. Patents

(57) ABSTRACT

A method of forming a low dielectric constant film. The low dielectric constant film is formed by passing gaseous silane into a reaction chamber and performing a plasma chemical vapor deposition to form a carbon-rich layer. Micro-particles deposited on the dielectric film are purged by ammonia. By adjusting the flow rate of ammonia, and the pressure and plasma density inside the reaction chamber, several ammonium plasma conditions are produced in sequence to clear the particles on the dielectric film.

13 Claims, 4 Drawing Sheets

FORM A LOW DIELECTRIC CONSTANT FILM IN A MAIN DEPOSITION (GASEOUS SILANE SUCH AS TETRA-METHYL SILANE AND OXYGEN OR NITROGEN OXIDE PLASMA ARE USED IN A PLASMA CHEMICAL VAPOR DEPOSITION)

SHUT DOWN FLOW OF NITROGEN OXIDE,SUPPLY AMMONIA AT A FLOW RATE 40%–60% OF NITROGEN OXIDE,REDUCE REACTION CHAMBER PRESSURE TO 60%–80% OF MAIN DEPOSITION ,REDUCE PLASMA DENSITY TO 0.3–0.5 W/cm$^2$ AND PERFORM MICRO-PARTICLE PURGING BETWEEN 1–5 SECONDS

SHUT DOWN FLOW OF NITROGEN OXIDE,SUPPLY AMMONIA AT A FLOW RATE 20%–40% OF NITROGEN OXIDE ,REDUCE REACTION PRESSURE TO 30%–50% OF MAIN DEPOSITION,REDUCE PLASMA DENSITY TO 0.5–0.7 W/cm$^2$ AND ,PERFORM PLASMA MICRO-PARTICLE PURGING BETWEEN 1–5 SECONDS

SHUT DOWN FLOW OF NITROGEN OXIDE,SUPPLY AMMONIA AT A FLOW RATE 5%–20% OF NITROGEN OXIDE,REDUCE REACTION CHAMBER PRESSURE TO BELOW 1 TORR,REDUCE PLASMA DENSITY BELOW 0.3 W/cm$^2$ AND PERFORM MICRO-PARTICLF PURGING BETWEEN 1–5 SECONDS

REDUCE GAS SUPPLY AND PLASMA DENSITY TO ZERO AND REDUCE REACTION CHAMBER PRESSURE TO A MINIMAL VALUE BY PUMPING

| SILICON WAFER NUMBER | PARAMETER SETTING | DIELECTRIC FILM THICKNESS(Å) | REFRACTIVE INDEX(RI) | NUMBER OF MICRO-PARTICLES(>0.2μm) | CARBON CONTENT WITHIN THE DIELECTRIC FILM(%) |
|---|---|---|---|---|---|
| 1 | – | 3015 | 1.4113 | >5000 | 16.5 |
| 2 | – | 3023 | 1.4114 | >5000 | 16.4 |
| 3 | – | 3009 | 1.4112 | >5000 | 16.5 |
| 4 | = | 3035 | 1.4116 | 23 | 15.5 |
| 5 | = | 3042 | 1.4117 | 15 | 15.6 |
| 6 | = | 3049 | 1.4117 | 9 | 15.3 |
| 7 | ≡ | 3012 | 1.4115 | 12 | 16.6 |
| 8 | ≡ | 3015 | 1.4114 | 18 | 16.4 |
| 9 | ≡ | 3007 | 1.4114 | 8 | 16.5 |

0.2 0.3 0.4

DISTRIBUTION OF MICRO-PARTICLE DIAMETERS IN THE LOW DIELECTRIC CONSTANT FILM ($\mu$m)

| SILICON WAFER NUMBER | PARAMETER SETTING | DIELECTRIC FILM THICKNESS(Å) | REFRACTIVE INDEX(RI) | NUMBER OF MICRO-PARTICLES(>0.2μm) | CARBON CONTENT WITHIN THE DIELECTRIC FILM(%) |
|---|---|---|---|---|---|
| 1 | 一 | 3015 | 1.4113 | >5000 | 16.5 |
| 2 | 一 | 3023 | 1.4114 | >5000 | 16.4 |
| 3 | 一 | 3009 | 1.4112 | >5000 | 16.5 |
| 4 | 二 | 3035 | 1.4116 | 23 | 15.5 |
| 5 | 二 | 3042 | 1.4117 | 15 | 15.6 |
| 6 | 二 | 3049 | 1.4117 | 9 | 15.3 |
| 7 | 三 | 3012 | 1.4115 | 12 | 16.6 |
| 8 | 三 | 3015 | 1.4114 | 18 | 16.4 |
| 9 | 三 | 3007 | 1.4114 | 8 | 16.5 |

FIG. 3

DISTRIBUTION OF MICRO-PARTICLE DIAMETERS IN THE LOW DIELECTRIC CONSTANT FILM ($\mu$m)

DISTRIBUTION OF MICRO-PARTICLE DIAMETERS IN THE LOW DIELECTRIC CONSTANT FILM ($\mu$m)

METHOD OF FABRICATING LOW DIELECTRIC CONSTANT FILM

BACKGROUND OF THE INVENTION

1. Field of Invention

The present invention relates to a method of fabricating a dielectric layer. More particularly, the present invention relates to a method of fabricating a carbon-rich low dielectric constant film.

2. Description of Related Art

Due to the rapid increase in circuit integration and functional integration, multi-layered conductive line systems with low dielectric constant material layers separating them are required. Conventionally, silicon oxide is used as the material constituting the dielectric layer. However, as the number of layers increases, overall thickness increases proportionately. Thickness can be reduced if the dielectric layer is made from a material having a lower dielectric constant. In general, the lower the dielectric constant of a dielectric layer, the thinner the dielectric layer is required to be to isolate the two neighboring conductive layers. Therefore, carbon-rich dielectric film, which has a lower dielectric constant than a conventional silicon oxide layer, is now routinely used in the fabrication of integrated circuits. The carbon-rich dielectric film is also capable of minimizing the effect of resistance-capacitance (RC) delay in a semiconductor circuit due to a narrowing of line width. In general, the carbon-rich low dielectric constant film is formed by plasma-enhanced chemical vapor deposition (PECVD) using gases having different carbon contents.

FIG. 1 is a flow chart showing the steps for producing a carbon-rich low dielectric constant film using a conventional PECVD process. In the PECVD, oxygen and nitrogen oxide plasma is used in the main deposition process. To prevent negatively charged particles in the plasma from depositing rapidly onto the dielectric film after plasma shut down, silicon-containing gases are first shut down after the main deposition process so that oxygen or nitrogen oxide plasma can still hold the negatively charged particles up a little longer. After a purging period, the particle is sucked out of the reaction chamber by a pump. According to surface energy theory, surface energy can be represented by a simple formula $4\pi r^2\gamma$, where $\gamma$ is the surface energy per unit area. For a plurality of smaller particles and one large particle having identical volume, the smaller particles have larger surface energy, resulting in rapid congregation, so that a smaller surface energy level is obtained. This explains why micro-particles within plasma congregate so rapidly.

Since negatively charged micro-particles may drop onto the low dielectric constant film and low dielectric constant film already has a lower density than a conventional silicate film, resistance against oxygen and nitrogen oxide is rather low. Ultimately, the low dielectric constant film may lose its low dielectric constant property.

SUMMARY OF THE INVENTION

Accordingly, one object of the present invention is to provide a method of fabricating a low dielectric constant film that can prevent surface oxidation of the dielectric film from oxygen plasma.

To achieve these and other advantages and in accordance with the purpose of the invention, as embodied and broadly described herein, the invention provides a method of forming a low dielectric constant film. A silicon substrate is provided. A main deposition is carried out inside a reaction chamber to form a carbon-rich low dielectric constant film over the substrate. The carbon-rich low dielectric constant film is formed by performing plasma chemical vapor deposition using plasma such as nitrogen oxide and nitrogen. After the formation of the dielectric film, the supply of nitrogen oxide to the reaction chamber is cut off while ammonia is passed into the reaction chamber so that the micro-particles over the dielectric film are purged. By adjusting the flow rate of ammonia, as well as the pressure and the plasma density inside the plasma reaction chamber, different ammonia plasma conditions are produced. Different plasma conditions of the ammonia are applied in sequence to clear away micro-particles on the dielectric film.

In this invention, ammonia plasma is used instead of nitrogen oxide and nitrogen plasma to carry out purging. The ammonia plasma can remove micro-particles from the surface of low dielectric constant film without causing any surface oxidation.

In addition, using different ammonia plasma conditions in the purging step prevents the rapid congregation of micro-particles within the plasma, in addition to keeping them from dropping onto the dielectric film. Hence, a quality carbon-rich low dielectric constant film is produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 is a table listing out the physical properties of dielectric film on nine silicon wafers fabricated using three different purging sequences according to this invention;

FIG. **4*a* is a diagram showing particle diameter distribution within the low dielectric film after purging with plasma having first condition parameters.

DESCRIPTION OF THE PREFERRED EMBODIMENTS

Figure 1:
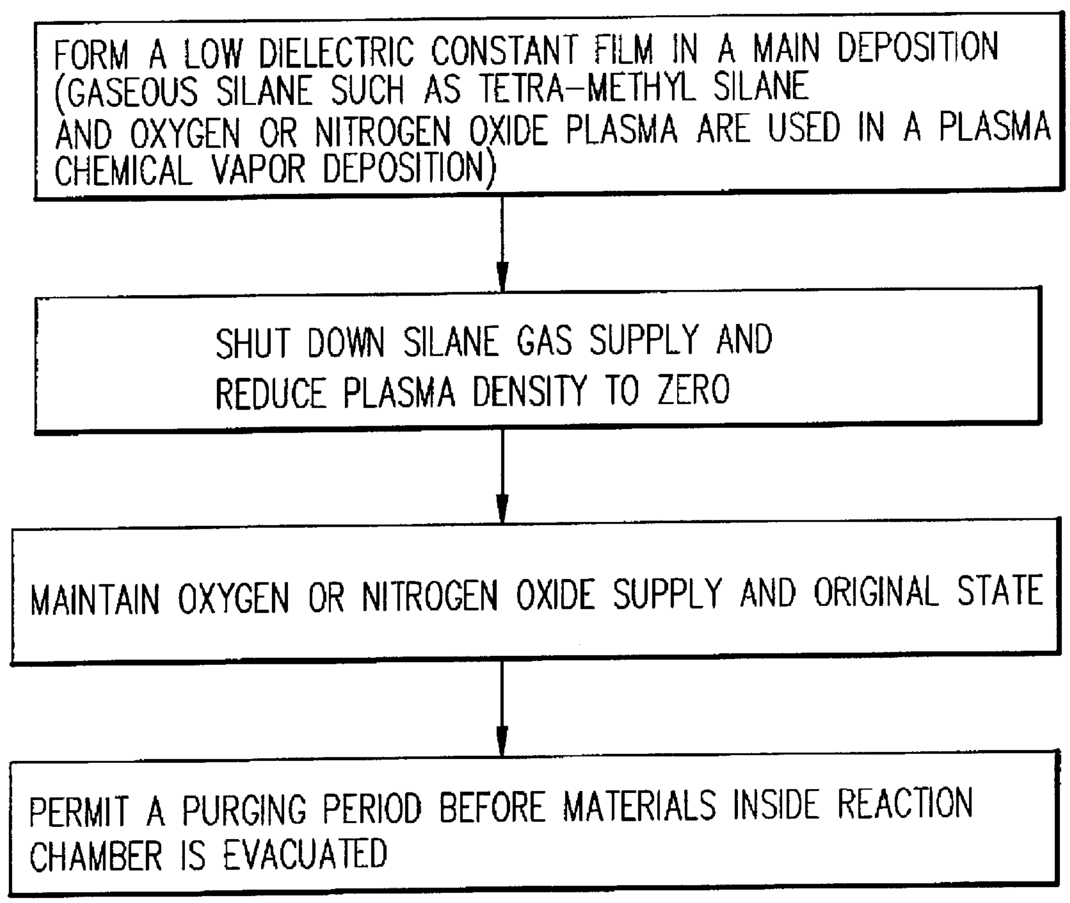
FIG. 1 is a flow chart showing the steps for producing a carbon-rich low dielectric constant film using a conventional PECVD process.

Reference will now be made in detail to the present preferred embodiments of the invention, examples of which are illustrated in the accompanying drawings. Wherever possible, the same reference numbers are used in the drawings and the description to refer to the same or like parts.

Figure 2:
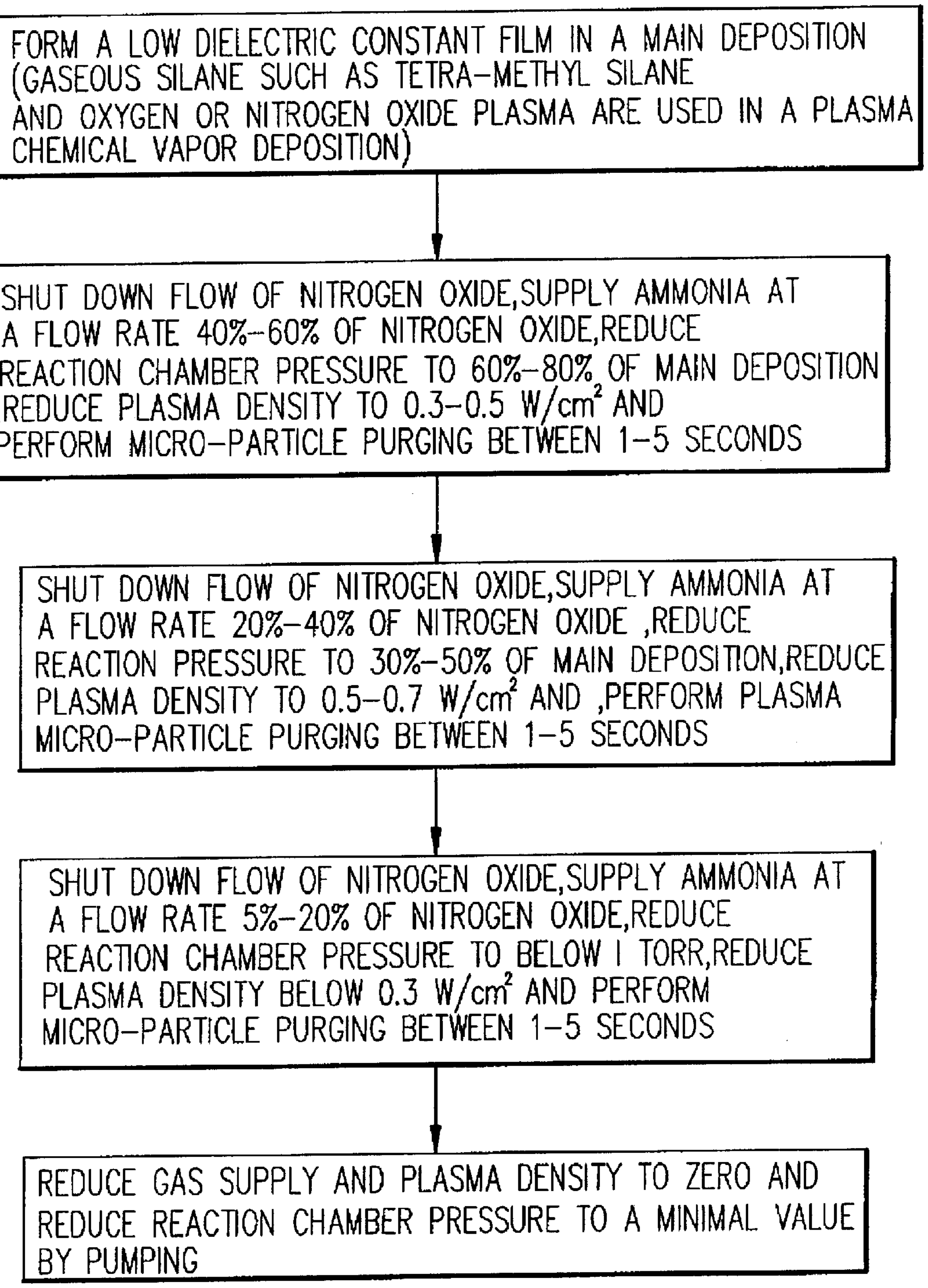
FIG. 2 is a flow chart showing the steps for producing a carbon-rich low dielectric constant film according to one preferred embodiment of this invention.

FIG. 2 is a flow chart showing the steps for producing a carbon-rich low dielectric constant film according to one preferred embodiment of this invention. The major aspect of this invention is the purging of micro-particles from a dielectric film after a main deposition process inside a plasma reaction chamber. A step-wise adjustment of the ammonia plasma parameter is carried out so that all micro-particles are effectively removed. The following is a detailed description of the ammonia plasma parameters used in the purging process.

First, a silicon substrate is provided. A main deposition is carried out inside a plasma reaction chamber using nitrogen oxide and nitrogen plasma to form a carbon-rich low dielectric constant film having a thickness of about 3000 Å over the substrate. Reactive gases for carrying out the main deposition include, for example, tetra methyl silane and oxygen-containing oxidized gases. The main deposition step is carried out inside a plasma reaction chamber at a temperature of about 400° C., a flow rate of gaseous tetra-methyl silane of about 1000 sccm, a flow rate of gaseous oxynitride of about 7000 sccm, a flow rate of gaseous nitrogen of about 1000 sccm, a pressure of about 2.8 torrs and a plasma density of about 0.8 $W/cm^2$.

In the main deposition step, since the plasma includes gaseous nitrogen oxide, the flow of nitrogen oxide into the reaction chamber needs to be stopped during the purging process so that the oxidation of the carbon-rich low dielectric constant film is prevented. On the other hand, the flow of gaseous nitrogen is maintained. Moreover, ammonia is also passed into the reaction chamber so that ammonia plasma can purge any remaining micro-particles after the main deposition step.

Ammonia plasma is generated inside the reaction chamber after the main deposition step. Parameters that control the properties of the ammonia plasma are adjusted so that the ammonia plasma is maintained in various conditions in sequence. In the first stage, plasma density is first reduced to about 0.5~0.7 $W/cm^2$ and the flow of nitrogen oxide into the reaction chamber is shut down. Gaseous ammonia having a flow rate of about 3000 sccm, roughly 40% to 60% of the former flow rate of gaseous nitrogen oxide, is permitted to flow into the reaction chamber. Pressure inside the reaction chamber is also lowered to about 2.0 torrs, roughly 60% to 80% of the pressure inside the reaction chamber during main deposition. Micro-particles are purged under the aforementioned first stage purging conditions for about 1 to 5 seconds.

In the second stage, plasma density inside the reaction chamber is reduced to about 0.3 to 0.5 $W/cm^2$. The flow rate of gaseous ammonia is adjusted to 2000 sccm, roughly 20% to 40% of the flow rate of gaseous nitrogen oxide during main deposition. Pressure inside the reaction chamber is also reduced to about 1.0 torr, roughly 30% to 50% of the pressure inside the reaction chamber during main deposition. Micro-particles are purged under the aforementioned second stage purging conditions for about 1 to 5 seconds.

In the third stage, plasma density inside the reaction chamber is reduced to a value below 0.3 $W/cm^2$. The flow rate of gaseous ammonia is further adjusted to 1000 sccm, roughly 5% to 20% of the flow rate of gaseous nitrogen oxide during main deposition. The gaseous nitrogen supply into the reaction chamber is completely shut off. Pressure inside the reaction chamber is further reduced to about 0.5 torr. Micro-particles are purged under the aforementioned third stage purging conditions for about 1 to 5 seconds.

In the fourth or last stage, plasma density and ammonia supply are reduced to zero. Pressure inside the reaction chamber is pumped to the lowest pressure, thereby ending the micro-particle purging process. Note that the various plasma parameters such as plasma density, flow rates of various gases, reaction chamber pressure and purging intervals may be separately adjusted according to processing requirements.

However, each parameter, including plasma type, plasma density, reaction chamber pressure and the flow rate of various gases, contributes to the effectiveness of micro-particle purging. In the following, three different plasma parameter settings are used to carry out micro-particle purging. For each plasma parameter setting, a carbon-rich low dielectric constant film having slightly different physical properties is produced.

First, a main deposition is carried out to form a carbon-rich low dielectric constant film. The main deposition is conducted, for example, at a temperature of about 400° C., a gaseous tetra-methyl silane flow rate of about 1000 sccm, a gaseous nitrogen oxide flow rate of about 7000 sccm, a gaseous nitrogen flow rate of about 1000 sccm, a reaction chamber pressure of about 2.8 torr and a plasma density of about 0.8 $W/cm^2$.

After the main deposition step, the following three plasma condition settings are employed to purge the micro-particles from the carbon-rich low dielectric constant film.

In the first purging sequence, the supply of gaseous nitrogen oxide and gaseous nitrogen plasma is continued. The supply of silicon-containing tetra-methyl silane is terminated while plasma density is reduced to zero. Micro-particle purging using nitrogen oxide and nitrogen plasma is conducted for about 10 seconds.

In the second purging sequence, the supply of gaseous nitrogen oxide and gaseous nitrogen plasma is continued. The supply of silicon-containing tetra-methyl silane is terminated. Plasma density is adjusted to about 0.6 $W/cm^2$ and the flow rate of nitrogen oxide is reduced to about 3500 sccm. Pressure inside the reaction chamber is reduced to about 2.0 torrs. A first micro-particle purging is conducted under such conditions for about 2 seconds. Thereafter, the plasma density is reduced to about 0.4 $W/cm^2$, the flow rate of gaseous nitrogen oxide is reduced to about 2000 sccm and the reaction chamber pressure is set to about 1.0 torr. A second micro-particle purging is conducted under such conditions for about 2 seconds. Subsequently, the plasma density is further reduced to about 0.2 $W/cm^2$, the flow rate of nitrogen oxide is reduced to 1000 sccm and the pressure inside the reaction chamber is further reduced to a value below 0.5 torr. A third micro-particle purging is conducted under such conditions for about 2 seconds. Finally, all gaseous supply is shut, the plasma density is reduced to zero and pressure inside the reaction chamber is reduced to a minimum value by a vacuum pump.

In the third purging sequence, the supply of gaseous nitrogen oxide and gaseous nitrogen plasma is continued. The supply of silicon-containing tetra-methyl silane is terminated. Plasma density is adjusted to about 0.6 $W/cm^2$ and the flow rate of nitrogen oxide is reduced to zero. The flow rate of gaseous ammonia into the reaction chamber is set to about 3500 sccm. Pressure inside the reaction chamber is set to about 2.0 torrs. A first micro-particle purging is conducted under such conditions for about 2 seconds. Thereafter, the plasma density is reduced to about 0.4 $W/cm^2$, the flow rate of gaseous ammonia is reduced to about 2000 sccm and the reaction chamber pressure is set to about 1.0 torr. A second micro-particle purging is conducted under such conditions for about 2 seconds. Subsequently, the plasma density is further reduced to about 0.2 $W/cm^2$, the flow rate of ammonia is reduced to 1000 sccm and the pressure inside the reaction chamber is further reduced to a value below 0.5 torr. A third micro-particle purging is conducted under such conditions for about 2 seconds.

Finally, all gaseous supply is shut, the plasma density is reduced to zero and pressure inside the reaction chamber is reduced to a minimum value by a vacuum pump.

FIG. 3 is a table listing out the physical properties of dielectric film on nine silicon wafers fabricated using three different purging sequences according to this invention. As shown in FIG. 3, for the silicon wafers numbered 1~3, the dielectric film has gone through a micro-particle purging operation using the first purging sequence. For the silicon wafers numbered 4~6, the dielectric film has gone through a micro-particle purging operation using the second purging sequence. Similarly, for the silicon wafers numbered 7~9, the dielectric film has gone through a micro-particle purging operation using the third purging sequence.

Figure 4A:
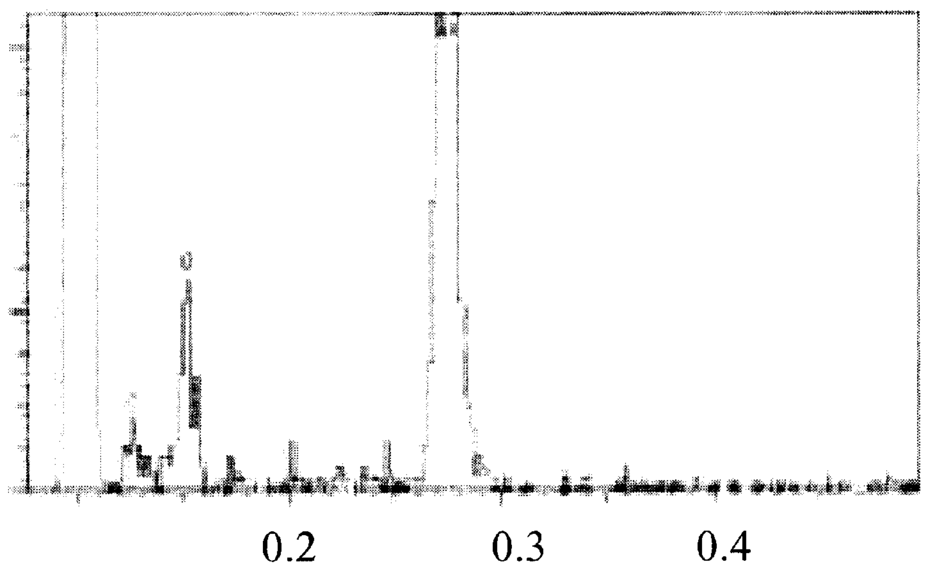
FIG. 4*b*** is a diagram showing particle diameter distribution on the low dielectric film after purging with plasma having first condition parameters.
Figure 4B:
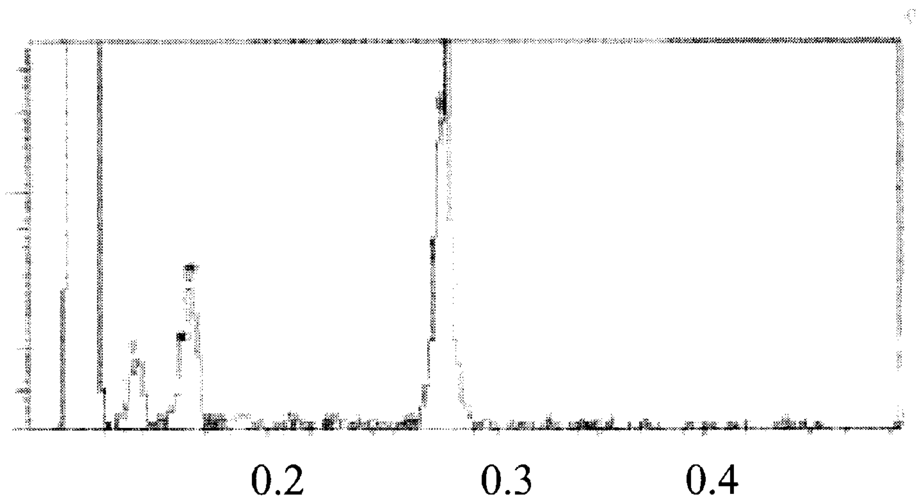

FIG. 4*a* is a diagram showing particle diameter distribution within the low dielectric film after purging with plasma having first condition parameters. FIG. 4*b* is a diagram showing particle diameter distribution on the low dielectric film after purging with plasma having first condition parameters. Elemental analysis of the graphs in FIGS. 4*a* and 4*b* reflect similar particle diameter distribution. This indicates that the micro-particles on the dielectric film are grown out of the plasma. Most microparticles have a diameter between 0.2 to 0.3 $\mu$m and most of them are congregations of small rounded particles. The distribution of micro-particle diameters and constructs is shown in FIG. 4*b*.

The number of micro-particles on a low dielectric constant film is under 30 when the second or the third purging sequence is used. The main reason is that the nitrogen oxide plasma in the second purging sequence and the ammonia plasma in the third purging sequence serve to suspend micro-particles in the plasma. By lowering the pressure inside the reaction chamber, the plasma density, the gas flow rates, and pumping the plasma out of the reaction chamber, the probability of micro-particles dropping onto the silicon wafer is lowered considerably. Although purging sequences two and three both manage to control the number of micro-particles to fewer than 30, the oxygen-containing nitrogen oxide plasma in the second purging sequence may damage the low dielectric constant film. Consequently, the carbon content of a superficial layer of the dielectric film having a thickness between 300 Å to 400 Å may drop, as shown in FIG. 3. A drop in carbon content in a superficial layer of the dielectric film may lead to a change in physical properties. Ultimately, the dielectric constant of the low dielectric constant film is increased and subsequent etching is rendered more difficult.

As shown in FIG. 3, the third purging sequence provides the cleanest micro-particle removal. Purging using ammonia not only prevents the oxidation of the low dielectric constant film, but also limits the amount of drop in carbon content within the film. In addition, quantity of micro-particles on the low dielectric constant film is contained.

In conclusion, one major aspect of this invention is the replacement of oxygen or nitrogen oxide plasma by ammonia plasma so that plasma oxidation of low dielectric constant film is prevented. Another advantage of using ammonia plasma is that the low dielectric constant film can have a uniform carbon content instead of being segregated into carbon-rich and carbon-poor layers. One further advantage of using ammonia to perform micro-particle purging is that the ammonia can force the micro-particles into suspension inside the plasma. Hence, with a corresponding lowering of the reaction chamber pressure, and the plasma density and gas flow rates, the number of micro-particles remaining on the low dielectric constant layer is minimal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a low dielectric constant film, comprising the steps of:

providing a substrate;

performing a plasma chemical vapor deposition to form a dielectric film on the substrate using a first deposition parameter setting, wherein the dielectric film includes a carbon-rich low dielectric constant film; and performing a micro-particle purging of the dielectric film using ammonia plasma.

2. The method of claim 1, wherein a plasma used in the plasma chemical vapor deposition includes nitrogen oxide and nitrogen plasma.

3. The method of claim 1, wherein the ratio of ammonia in the ammonia plasma relative to other gases used in the depositing step is adjusted in an ordered sequence to purge the dielectric film.

4. The method of claim 1, wherein nitrogen oxide and nitrogen plasma are used in the depositing step and the purging of the dielectric film is conducted in steps by varying the ratio of ammonia in the ammonia plasma relative to the nitrogen oxide and nitrogen.

5. The method of claim 4, wherein the ammonia plasma has four parameter settings, including a first parameter setting, a second parameter setting, a third parameter setting and a fourth parameter setting such that, in the first parameter setting of the ammonia plasma, the flow rate of gaseous nitrogen remains unchanged while the flow rate of ammonia is at 40% to 60% of the nitrogen oxide flow rate during plasma chemical vapor deposition.

6. The method of claim 5, wherein the first parameter setting further includes a reaction chamber pressure at about 60%–80% of the pressure inside the reaction chamber during plasma chemical vapor deposition, a plasma density of about 0.5–0.7 W/cm$^2$ and a reaction time of between 1–5 seconds.

7. The method of claim 4, wherein the ammonia plasma has four parameter settings, including a first parameter setting, a second parameter setting, a third parameter setting and a fourth parameter setting such that, in the second parameter setting of the ammonia plasma, the flow rate of gaseous nitrogen remains unchanged while the flow rate of ammonia is at 20% to 40% of the nitrogen oxide flow rate during plasma chemical vapor deposition.

8. The method of claim 7, wherein the second parameter setting further includes a reaction chamber pressure at about 30%–50% of the pressure inside the reaction chamber during plasma chemical vapor deposition, a plasma density of about 0.3–0.5 W/cm$^2$ and a reaction time of between 1–5 seconds.

9. The method of claim 5, wherein the ammonia plasma has four parameter settings, including a first parameter setting, a second parameter setting, a third parameter setting and a fourth parameter setting such that, in the third parameter setting of the ammonia plasma, the supply of gaseous nitrogen is cut off while the flow rate of ammonia is at 5% to 20% of the nitrogen oxide flow rate during plasma chemical vapor deposition.

10. The method of claim 9, wherein the third parameter setting further includes a reaction chamber pressure smaller than 1 torr a plasma density smaller than 0.3 W/cm$^2$ and a reaction time of between 1–5 seconds.

11. The method of claim 5, wherein the ammonia plasma has four parameter settings, including a first parameter setting, a second parameter setting and third parameter setting and a fourth parameter setting such that, in the fourth parameter setting of the ammonia plasma, the supply of gaseous ammonia is cut off while the pressure inside the reaction chamber is reduced to a minimal value by pumping.

12. The method of claim 1, wherein conditions for depositing the low dielectric constant film include a temperature of about 400° C., a gaseous tetra-methyl silane flow rate of about 1000 sccm, a gaseous nitrogen oxide flow rate of about 7000 sccm, a gaseous nitrogen flow rate of about 1000 sccm, a pressure of about 2.8 torrs and a plasma density of about 0.8 $W/cm^2$.

13. A method of forming low dielectric constant film, comprising the steps of:

providing a substrate;

performing a plasma chemical vapor deposition to form a dielectric film over the substrate using a first deposition parameter setting;

adjusting plasma parameters including gradually reducing gaseous ammonia flow rate, plasma density and reaction chamber pressure used in the plasma chemical vapor deposition to produce a plurality of ammonia plasma conditions; and purging micro-particles on the dielectric film by setting up the various ammonia plasma conditions in sequence.

* * * * *